US007012482B2

(12) United States Patent
Rawnick et al.

(10) Patent No.: US 7,012,482 B2
(45) **Date of Patent: *Mar. 14, 2006**

(54) RF PHASE DELAY LINES WITH VARIABLE DISPLACEMENT FLUIDIC DIELECTRIC

(75) Inventors: James J. Rawnick, Palm Bay, FL (US); Stephen B. Brown, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 43 days.

This patent is subject to a terminal disclaimer.

(21) Appl. No.: 10/678,484

(22) Filed: Oct. 3, 2003

(65) Prior Publication Data

US 2005/0073376 A1 Apr. 7, 2005

(51) Int. Cl.
*H03H 7/20* (2006.01)
*H01P 1/18* (2006.01)

(52) U.S. Cl. ........................ 333/156; 333/139; 333/161

(58) Field of Classification Search ........ 333/138–140, 333/156–158, 161
See application file for complete search history.

(56) References Cited

U.S. PATENT DOCUMENTS 3,566,311 A * 2/1971 Buck .......................... 333/161
3,701,058 A * 10/1972 Smith ......................... 333/159
4,450,500 A * 5/1984 Wollenschlager ........... 361/277
5,162,972 A 11/1992 Gripshover et al.
5,990,760 A * 11/1999 Yoshida et al. ............. 333/161
6,443,179 B1 * 9/2002 Benavides et al. ....... 137/454.2
6,515,235 B1 2/2003 Moller
2001/0017577 A1 * 8/2001 Toko et al. ................. 333/161
2004/0178865 A1 * 9/2004 Snyder et al. .............. 333/156
2005/0052260 A1 * 3/2005 Brown et al. ............... 333/161

OTHER PUBLICATIONS

U.S. Appl. No. 10/369,436, filed Feb. 18, 2003, Rawnick et al.
U.S. Appl. No. 10/387,208, filed Mar. 11, 2003, Rawnick et al.
U.S. Appl. No. 10/330,755, filed Dec. 27, 2002, Rawnick et al.
U.S. Appl. No. 10/330,754, filed Dec. 27, 2002, Rawnick et al.
U.S. Appl. No. 10/330,456, filed Nov. 19, 2002, Rawnick et al.
U.S. Appl. No. 10/361,548, filed Feb. 10, 2003, Rawnick et al.
U.S. Appl. No. 10/387,209, filed Mar. 11, 2003, Rawnick et al.
U.S. Appl. No. 10/387,194, filed Mar. 11, 2003, Brown et al.

(Continued)

*Primary Examiner*—Seungsook Ham
(74) *Attorney, Agent, or Firm*—Sacco & Associates, PA

(57) ABSTRACT

A phase delay line (100). The phase delay line can include an RF transmission line (110) and a fluid channel (109) having a serpentine configuration. The transmission line can be coupled to a solid dielectric substrate material (102), for example a substrate formed from a low temperature co-fired ceramic material. The fluid channel can be coupled to the RF transmission line along at least a portion of a length of the transmission line. A phase delay of the RF transmission line can be selectively varied by adjusting a distribution of the fluidic dielectric (130) present within the fluid channel. Similarly, the phase delay of the RF transmission line also can be maintained constant as an operational frequency of the RF transmission line is varied.

30 Claims, 3 Drawing Sheets

OTHER PUBLICATIONS

U.S. Appl. No. 10/438,435, filed May 15, 2003, Brown et al.
U.S. Appl. No. 10/414,696, filed Apr. 16, 2003, Brown et al.
U.S. Appl. No. 10/637,027, filed Aug. 7, 2003, Brown et al.
U.S. Appl. No. 10/414,650, filed Apr. 16, 2003, Brown et al.
U.S. Appl. No. 10/635,629, filed Aug. 6, 2003, Brown et al.
U.S. Appl. No. 10/459,067, filed Jun. 11, 2003, Brown et al.
U.S. Appl. No. 10/438,436, filed May 15, 2003, Rawnick et al.
U.S. Appl. No. 10/626,090, filed Jul. 24, 2003, Brown et al.
U.S. Appl. No. 10/635,582, filed Aug. 6, 2003, Rawnick et al.
U.S. Appl. No. 10/632,632, filed Aug. 1, 2003, Rawnick et al.
U.S. Appl. No. 10/614,149, filed Jul. 7, 2003, Brown et al.
U.S. Appl. No. 10/634,219, filed Aug. 5, 2003, Rawnick et al.
U.S. Appl. No. 10/458,859, filed Jun. 11, 2003, Rawnick et al.
U.S. Appl. No. 10/624,378, filed Jul. 22, 2003, Brown et al.
U.S. Appl. No. 10/438,433, filed May 15, 2003, Rawnick et al.
U.S. Appl. No. 10/460,947, filed Jun. 13, 2003, Rawnick et al.
U.S. Appl. No. 10/421,352, filed Apr. 23, 2003, Rawnick et al.
U.S. Appl. No. 10/409,261, filed Apr. 8, 2003, Pike.
U.S. Appl. No. 10/441,743, filed May 19, 2003, Pike.
U.S. Appl. No. 10/628,846, filed Jul. 28, 2003, Pike et al.
U.S. Appl. No. 10/300,455, filed Nov. 19, 2002, Brown et al.
U.S. Appl. No. 10/637,409, filed Aug. 8, 2003, Brown et al.
U.S. Appl. No. 10/640,237, filed Aug. 13, 2003, Rawnick et al.
U.S. Appl. No. 10/640,148, filed Aug. 13, 2003, Brown et al.

* cited by examiner

RF PHASE DELAY LINES WITH VARIABLE DISPLACEMENT FLUIDIC DIELECTRIC

BACKGROUND OF THE INVENTION

1. Statement of the Technical Field

The present invention relates to the field of phase delays, and more particularly to variable phase delays.

2. Description of the Related Art

Delay lines such as phase delays are used for a wide variety of signal processing applications. For example, broadband phase delay circuits are used in beam-forming applications in phased array antennas. Typical fixed geometry phase delay circuits used in phased array antennas are comprised of switched lengths of transmission line. Despite the importance of broadband delay lines in such systems, the conventional approach to designing and implementing these components suffer from a number of drawbacks. For example, conventional delay line devices often require a relatively large number of RF switches that can result in signal losses. Also, conventional phase delay circuits can be limited with regard to the delay resolution that can be achieved.

RF delay lines are often formed as ordinary transmission lines coupled to a dielectric. Depending upon the structure of the transmission line, the dielectric can be arranged in different ways. For example, microstrip and stripline circuits commonly are formed on a dielectric substrate. Two important characteristics of dielectric materials are permittivity (sometimes called the relative permittivity or $\epsilon_r$) and permeability (sometimes referred to as relative permeability or $\mu_r$). The relative permittivity and permeability determine the propagation velocity of a signal, which is approximately inversely proportional to $\sqrt{\mu\epsilon}$. The propagation velocity directly affects the electrical length of a transmission line and therefore the amount of delay introduced to signals that traverse the line.

Further, ignoring loss, the characteristic impedance of a transmission line, such as stripline or microstrip, is equal to $\sqrt{L_l/C_l}$ where $L_l$ is the inductance per unit length and $C_l$ is the capacitance per unit length. The values of $L_l$ and $C_l$ are generally determined by the permittivity and the permeability of the dielectric material(s) used to separate the transmission line structures as well as the physical geometry and spacing of the line structures. For a given geometry, an increase in dielectric permittivity or permeability necessary for providing increased phase delay will generally cause the characteristic impedance of the line to change. However, this is not a problem where only a fixed delay is needed, since the geometry of the transmission line can be readily designed and fabricated to achieve the proper characteristic impedance.

When a phase delay is needed, however, such techniques have traditionally been viewed as impractical because of the obvious difficulties in dynamically varying the permittivity and/or permeability of a dielectric board substrate material and/or dynamically varying transmission line geometries. Variable length lines have been implemented using mechanical means to vary the length of a line. These generally have involved an arrangement of telescoping tubes to produce a variable length coaxial line. These devices were at one time commonly used in laboratories for tuning circuits. However, these arrangements suffered from certain drawbacks. For example, they were subject to wear, difficult to control electronically, and are not easily scalable to microwave frequencies. Accordingly, the solution has been to design phase delay lines using conventional fixed length RF transmission lines with delay variability achieved using a series of electronically controlled switches.

Ferroelectric materials are also sometimes used to implement compact phase delays for various applications. The phase delay can be implemented by applying a bias electric field to the ferroelectric material, which changes the permittivity of the material. The use of ferroelectric material in the microwave frequency range has been limited, however, due to high losses associated with these materials and due to the high electric field necessary to bias the structure in order to obtain substantial permittivity change.

A microwave phase shifter is a device that can be used for varying phase in the microwave frequency range. The microwave phase shifter is a thin-film ferroelectric/ferrite device. A microwave phase shifter can be tuned by varying both electric and magnetic fields. For instance, the propagation velocity of electromagnetic waves in the microwave phase shifter can be varied by applying an electric field to vary the permittivity of the ferroelectric layer and/or varying an applied magnetic field to vary the permeability of the ferrite layer. In operation, the microwave phase shifter is limited to a phase shift of about 300°. Moreover, a magnetic field of greater than 800 Gauss is required to achieve this phase shift. Such a magnetic field can interfere with the operation of other circuit devices that are proximate to the microwave phase shifter. Further, the microwave phase shifter is not suitable for use in monolithic microwave integrated circuits.

SUMMARY OF THE INVENTION

The present invention relates to a phase delay line. The phase delay line can include an RF transmission line and a fluid channel having a serpentine configuration. The transmission line can be coupled to a solid dielectric substrate material, for example a substrate formed from a low temperature co-fired ceramic material. The fluid channel can be coupled to the RF transmission line along at least a portion of a length of the transmission line. A phase delay of the RF transmission line can be selectively varied by adjusting a relative distribution of two fluidic dielectrics present within the fluid channel. Similarly, the phase delay of the RF transmission line also can be maintained constant as an operational frequency of the RF transmission line is varied.

The fluidic dielectrics can include an industrial solvent. A suspension of magnetic particles can be contained within the solvent. For example, the magnetic particles can be ferrite, metallic salts, and organo-metallic particles. A second fluidic dielectric also can be provided within the fluid channel. The first and second fluidic dielectrics can be immiscible and can be separated by an immiscible fluid interface. Moreover, the second fluidic dielectric can have a permittivity and/or a permeability that is different from the permittivity and/or permeability of the first fluidic dielectric. The respective permittivities and permeabilities can be selected for maintaining a constant or a variable characteristic impedance along an entire length of the RF transmission line.

The phase delay line can include at least one variable displacement fluid processor. The variable displacement fluid processor can change a distribution of the first and second fluidic dielectrics relative to the transmission line. In consequence, a phase delay of the transmission line can be selectively varied by changing the distribution of at least the first fluidic dielectric in the fluid channel. The variable displacement fluid processor can include at least one high volume pump for coarse adjustment of the distribution and one low volume displacement pump for fine adjustment of the distribution. The variable displacement fluid processor can further include a fluid conduit with a port for communicating the first and second fluidic dielectrics to the fluid channel.

The present invention also relates to a method of producing a phase delay for an RF signal. The method includes the step of propagating the RF signal along an RF transmission line. The method also includes the step of positioning a fluidic dielectric within a fluid channel having a serpentine configuration which is coupled to a portion of the RF transmission line. The fluidic dielectric can be positioned to selectively control the coupling between the first fluidic dielectric and the RF transmission line, thereby varying a phase delay of the transmission line.

The method can further include the step of positioning a second fluidic dielectric within the fluid channel. The first and second fluidic dielectrics can be immiscible and separated by an immiscible fluid interface. The first fluidic dielectric can have a first permittivity and/or first permeability that is different from a second permittivity and/or a second permeability of the second fluidic dielectric, respectively. The distribution of the first and second fluidic dielectrics relative to the transmission line can be changed. The distribution of the first and second fluidic dielectrics can be varied along a length of the fluid channel. Further, the permeability and/or permittivity of the first and/or second fluidic dielectrics can be selected for maintaining a constant characteristic impedance along a length of the RF transmission line.

The RF transmission line can be coupled to a solid dielectric substrate, such as a dielectric substrate formed form a ceramic material. For example, the dielectric substrate can be formed from low temperature co-fired ceramic. The first and/or second fluidic dielectrics can be selected to have a permittivity and/or permeability that is different as compared to the solid dielectric substrate The first and/or second fluidic dielectrics can include an industrial solvent. The solvent can have a suspension of magnetic particles contained therein. The magnetic particles can be ferrite, metallic salts, and/or organo-metallic particles.

DETAILED DESCRIPTION OF THE INVENTION

The present invention relates to a method and a system for controlling a phase delay of an RF transmission line by coupling a fluidic dielectric to the RF transmission line. A phase delay of the RF transmission line can be selectively varied by adjusting a distribution of first and second fluidic dielectrics present in a serpentine fluid channel coupled to the RF transmission line. Further, the phase delay of the RF transmission line can be maintained constant as an operational frequency of the RF transmission line is varied. Moreover, the fluidic dielectrics can have a permeability and a permittivity selected for maintaining a constant characteristic impedance along an entire length of the RF transmission line.

The change in distribution of the fluidic dielectrics can cause a permittivity ($\in$) and/or a permeability ($\mu$) in channel segments proximate to the transmission line to vary. Since the propagation velocity of a signal is approximately inversely proportional to $\sqrt{\mu\in}$, the change in permittivity and/or permeability in a channel segment will cause the propagation velocity (and therefore the amount of phase delay introduced) to be adjusted on a portion of the transmission line which is coupled to the channel segment. For example, as $\sqrt{\mu\in}$ is increased in the channel segment, a propagation velocity of a signal on the transmission line will decrease. Similarly, as $\sqrt{\mu\in}$ is decreased in the channel segment, the propagation velocity will decrease.

Figure 1:
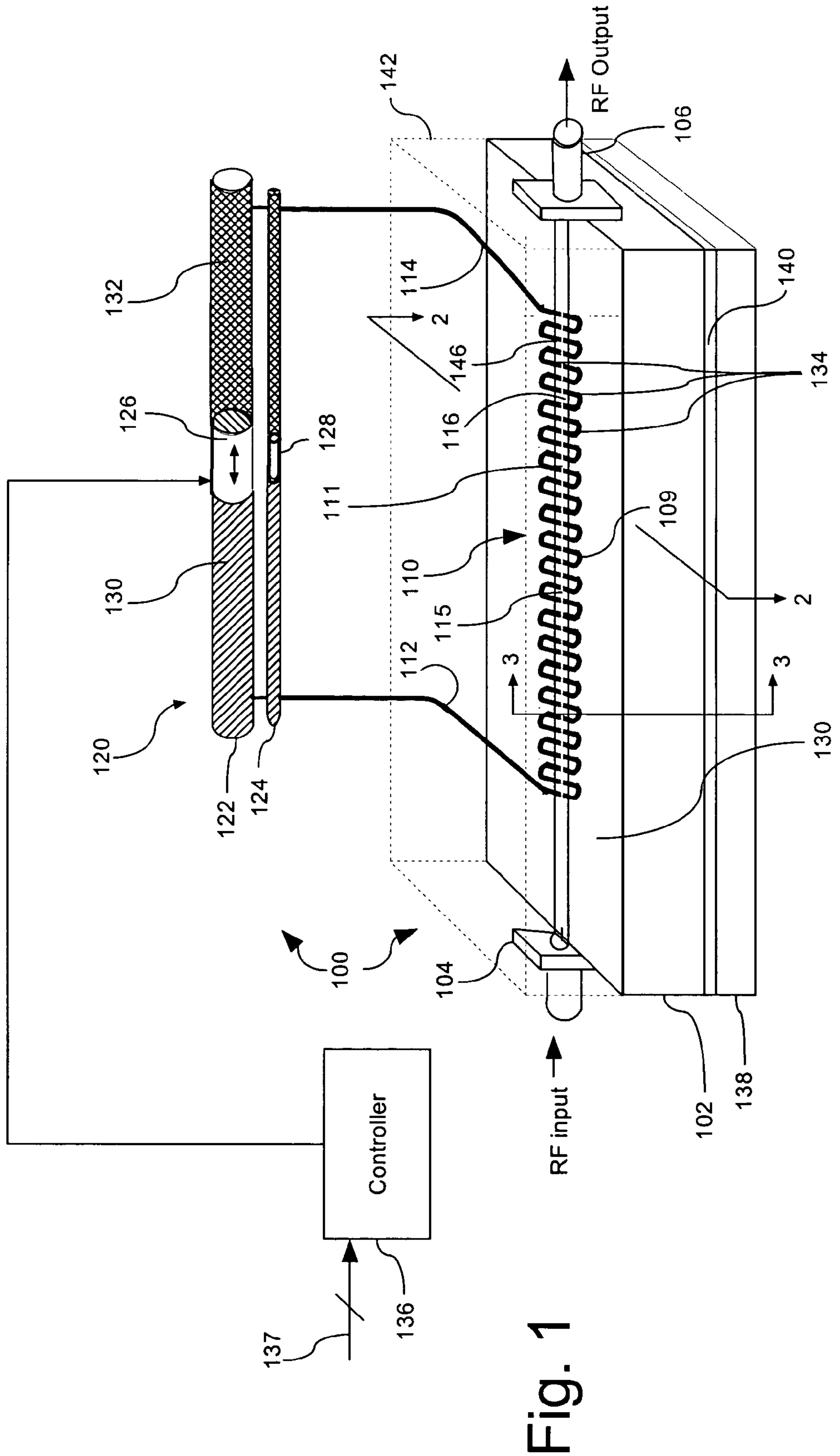
FIG. 1 is a perspective view of a phase delay line useful for understanding the invention.

FIG. 1 is a perspective view of a phase delay line that is useful for understanding the present invention. The phase delay line 100 includes an RF transmission line 110. The RF transmission line 110 comprises a conductor 111 disposed on a substrate 102, which is positioned over a suitable ground plane 140. However, the invention is not limited to any particular type of transmission line. Instead, it should be understood that the invention as described herein can be used with any type of transmission line structure that can be coupled to a fluid channel as shall hereinafter be described in greater detail. RF input connector 104 and RF output connector 106 can be provided for communicating RF signals to and from the phase delay line 100. However, the delay line also can be integrated onto a circuit board with other associated circuitry so as to avoid the need for such connectors.

One or more fluid channels 109 can be embedded within the substrate 102. The fluid channel 109 preferably extends adjacent to a region of the transmission line conductor 111 so that fluidic dielectrics 130, 132 contained in the fluid channel can be electrically and magnetically coupled to the fields that are generated when RF signals are propagated along the transmission line. For example, the fluid channel 109 can be positioned beneath the transmission line conductor 111. In operation, the volume and shape of the fluids 130, 132 that are coupled to the transmission line 110 can be selectively varied to dynamically change the propagation delay for signals transmitted on the transmission line 110. More particularly, the portion of the length of transmission line conductor 111 that is coupled to the fluid 130 in fluid channel 109 and the portion of the length that is coupled to the fluid 132 can be dynamically controlled.

According to one embodiment of the invention, the fluid channel 109 can be formed as an elongated channel traversing in a serpentine fashion beneath transmission line conductor 111. In particular, the fluid channel 109 can be provided with a plurality of fluid channel segments 134 that extend beneath the transmission line conductor 111. Any number of fluid channel segments 134 can be provided, depending on the amount of phase shift control that is desired. For instance, a greater number of fluid channel segments 134 can provide a greater range of phase adjustment.

Figure 2:
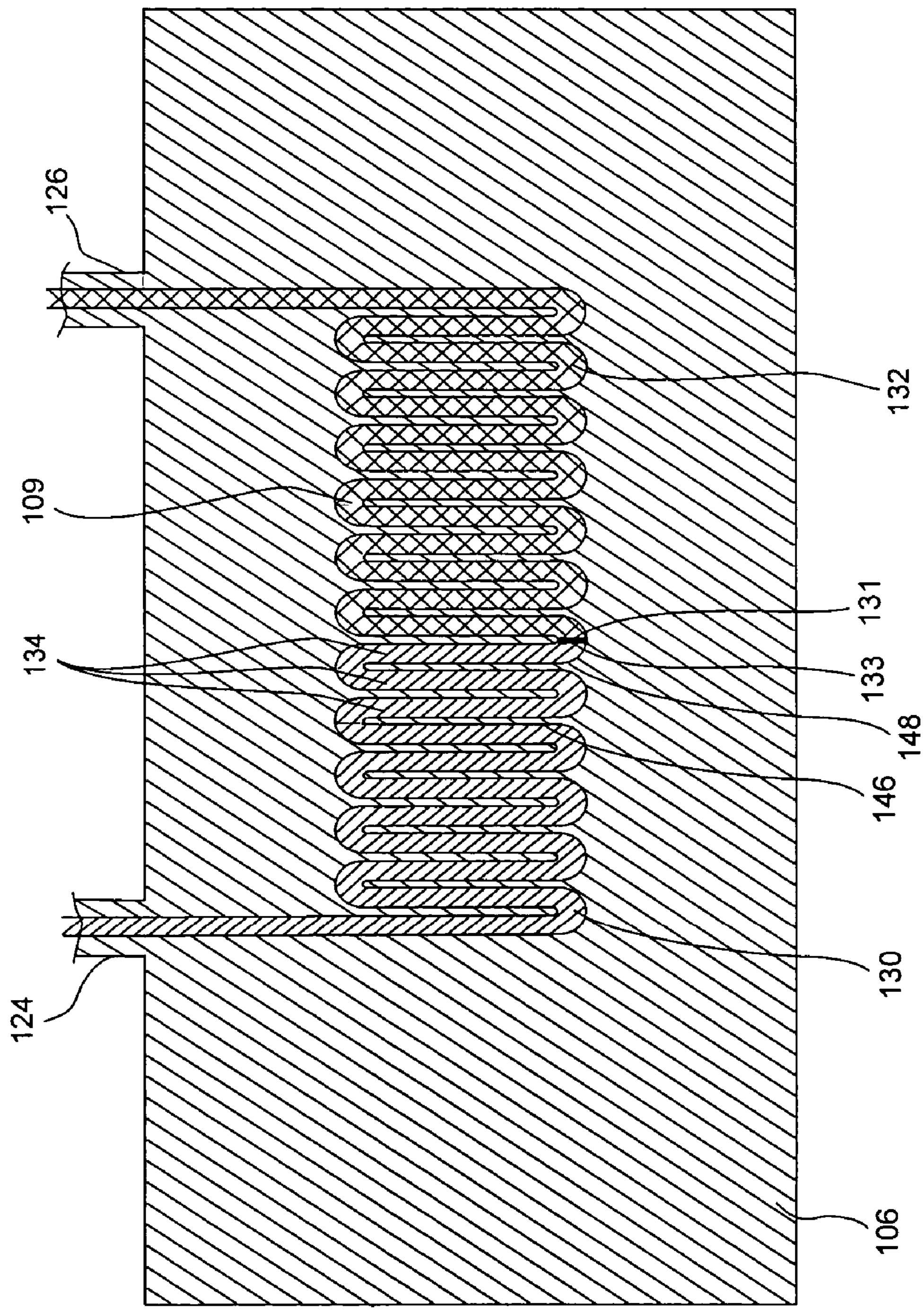
FIG. 2 is a cross-sectional view of the phase delay line in FIG. 1 taken along line 2—2.
Figure 3:
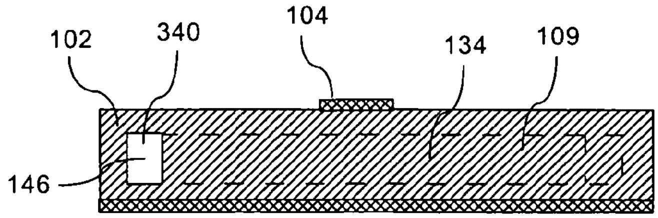
FIG. 3 is a cross-sectional view of the phase delay line in FIG. 1 taken along line 3—3.

Referring now to FIGS. 2 and 3, there is shown a cross-sectional view of the variable delay line taken along line 2—2 and 3—3, respectively, in FIG. 1. In the preferred arrangement, the two fluidic dielectrics 130, 132 are immiscible. Accordingly, an immiscible fluid interface 131 will be formed between the first fluidic dielectric 130 and the second fluidic dielectric 132 when the two fluids are contained within the fluid channel 109. For example, if one of the fluidic dielectrics is water based and the second fluidic dielectric is oil based, then an immiscible fluid interface will be formed between them. In the oil and water example, it may also be necessary to change the physical orientation of the transmission line 110 and the associated fluid channel 109 to a vertical orientation to make effective use of these liquid's tendency to separate above and below one another. However, the invention is not so limited and any other suitable set of immiscible fluids can be used for this purpose provided that they have, or can be made to have, the desired electrical and magnetic properties.

The dimensions of each channel segment 134 can be selected to contain an amount of fluidic dielectric within the channel segment 134 which is necessary to effectuate desired changes in propagation velocity of a signal on the transmission line 110. For example, each channel segment 134 can be dimensioned to contain an appropriate amount of the first fluidic dielectric 130 to provide a specific phase adjustment at a particular operating frequency. A different phase adjustment can be achieved by filling the channel segment with the second fluidic dielectric 132. Although the fluid channel 109 is shown as having a rectangular cross section 340 in FIG. 3, the invention is not so limited. Importantly, the fluid channel 109 can have any desired dimensions. For example, the cross section 340 of the fluid channel 109 can be circular, oval, triangular, square, or have any other desired shape.

Advantageously, the fluid channel 109 can be arranged such that cross section 340 is a relatively small channel normal to a direction of fluid flow, yet a large number of fluid channel segments 134 can be provided. Accordingly, the fluid channel 109 can provide significant fluidic dielectric storage volume proximate to the transmission line conductor 111 while allowing a high degree of tuning precision. For example, the dimensions of each channel segment 134 can be selected to provide 1° of phase delay when filled with the first fluidic dielectric 130 and ½° of phase delay when filled with the fluidic dielectric 132.

Making reference to FIGS. 1, 2 and 3, the operation of the phase delay unit now can be described. The first fluidic dielectric 130 is preferably coupled along a first portion 115 of the transmission line and the second fluidic dielectric 132 is preferably coupled to the RF transmission line 110 along a second portion 116 thereof which is distinct from the first portion 115. Since the propagation velocity of a signal is approximately inversely proportional to $\sqrt{\mu\in}$, the different permittivity and/or permeability of the first and second fluidic dielectrics 130, 132 will cause the propagation velocity (and therefore the amount of phase delay introduced) to be different for signals on the portion of the transmission line coupled to the first dielectric 130 as compared to the portion coupled to the second fluidic dielectric 132.

As the first fluidic dielectric 130 is injected into the fluid channel 109, the second fluidic dielectric 132 can be removed. Similarly, as the first fluidic dielectric 130 is removed from the fluid channel 109, the second fluidic dielectric 132 can be injected into the fluid channel 109. In either case, there will be a corresponding movement of the immiscible fluid interface 131.

When injected into the fluid channel 109, the first fluidic dielectric 130 preferably progresses through the fluid channel 109 such that the first fluidic dielectric 130 replaces the second fluidic dielectric 132 and the immiscible fluid interface sequentially moves through the fluid channel segments 134. Accordingly, the permittivity and permeability within one or more channel segments 134 can become equal, or substantially equal, to the permittivity and permeability of the first fluidic dielectric 130 as it displaces the second fluidic dielectric 132, thereby adjusting the phase delay of the transmission line 111. By subsequently purging the first fluidic dielectric 130 from the channel segments 134 and injecting the second fluidic dielectric 132, the phase again can be adjusted. For example, the permittivity and permeability within one or more channel segments 134 can become equal, or substantially equal, to the permittivity and permeability of the second fluidic dielectric 132 as it displaces the first fluidic dielectric 130.

In either case it is preferred that the immiscible fluid interface 131 remain intact and substantially perpendicular to the walls 146 of the fluid channel 109. Significantly, the relatively small cross section 340 of the fluid channel 109 can facilitate maintaining the immiscible fluid interface 131. In particular, the stability of the immiscible fluid interface 131 is a function of the surface tension of the respective fluids and the surface area of the immiscible fluid interface.

Surface tension results from the cohesive forces between fluid molecules. Specifically, molecules at the surface 133 of the fluidic dielectric 130 do not have other like molecules on all sides of them. Consequently the molecules cohere more strongly to those molecules with which they are directly associated on the surface 133 of the fluidic dielectric 130. This forms a surface barrier which resists the movement of another material, such as the second fluidic dielectric 132, through the surface. Further, the fluidic dielectric 130 also can adhere to the wall 146 of the fluid channel 109, which helps to maintain a uniform fluid surface 133 as the fluidic dielectric 130 is injected and purged from the channel 109.

A variable displacement fluid processor 120 can be provided to control the distribution and movement of the first and second fluidic dielectrics 130, 132 within the fluid channel 109. The variable displacement fluid processor 120 can be comprised of at least one displacement piston pump configured for changing a distribution of the first and second fluidic dielectrics relative to the transmission line 110. According to a preferred embodiment, greater accuracy of adjustments can be achieved with processor 120 by making use of a combination of pumps. For example, a high volume displacement piston pump 122 can be used for coarse adjustments and a low volume displacement piston pump 124 can be used for fine adjustments. Pistons 126 and 128 respectively can force the displacement of fluidic dielectrics 130,132 so as to control the relative portion of the transmission line to which each fluidic dielectric is coupled. The control of each of the pumps can be coordinated by the controller 136. Of course, other types of fluid displacement mechanisms can also be used and the invention is not intended to be limited to displacement piston pumps. Instead, any suitable mechanism can be used provided that it is capable of displacing the relative distribution of the first and second fluidic dielectrics within the fluid channel 109.

The variable displacement processor 120 can also include two or more fluid conduits 112, 114 for communicating each of the first and second fluidic dielectrics to the fluid channel 109. A fluid port (not shown) associated with fluid conduit 112 can be used to communicate the first fluidic dielectric from the conduit to the fluid channel portion 109 and a second fluid port (not shown) can communicate the second fluidic dielectric from the second conduit 114 to the fluid channel portion 109. As noted, selecting fluidic dielectrics 130, 132 to be immiscible results in the immiscible fluid interface 131 being formed between the two fluidic dielectrics 130, 132 when they are introduced within the fluid channel 109. Thereafter, by selectively controlling the displacement of fluidic dielectrics 130, 132 within the fluid channel region 109, the effective dielectric constant and permeability of the dielectric can be selectively varied in the portions of fluid channel 109 coupled to the transmission line 110. Since the propagation delay of any transmission line is determined by the permittivity and permeability of the surrounding dielectric, the variable displacement processor 120 can be used to control the phase delay associated with RF signals passing through transmission line 110. In one arrangement, the variable displacement processor 120 can maintain the phase delay constant as the operational frequency of the transmission line is varied.

According to a preferred embodiment, the permittivity and the permeability of the first and second fluidic dielectrics are selected so as to maintain a constant characteristic impedance for the transmission line 110. However, the invention is not so limited in that relatively small mismatches in impedance between portions of the line may be tolerable in certain applications.

Composition of the Fluidic Dielectrics

Making reference to FIG. 1, each of the first and second fluidic dielectrics can be comprised of any fluid composition having the required characteristics of permittivity and permeability as may be necessary for achieving a selected range of delay. Those skilled in the art will recognize that one or more component parts can be mixed together to produce a desired permeability and permittivity required for a particular phase delay and transmission line characteristic impedance. In this regard, it will be readily appreciated that fluid miscibility is a key consideration to ensure proper mixing of the component parts of each of the first and second fluidic dielectric. However, the selection of miscible component parts for the creation of each fluidic dielectric is not to be confused with the concept that it is preferred that the first fluidic dielectric 130 should be immiscible with the second fluidic dielectric 132.

Each of the first and second fluidic dielectrics 130, 132 also preferably has a relatively low loss tangent to minimize the amount of RF energy lost in the delay line device. However, devices with higher insertion loss may be acceptable in some instances so this may not be a critical factor. Many applications also require delay lines with a broadband response. Accordingly, it may be desirable in many instances to select fluidic dielectrics that have a relatively constant response over a broad range of frequencies.

Aside from the foregoing constraints, there are relatively few limits on the range of materials that can be used to form the fluidic dielectric. Accordingly, those skilled in the art will recognize that the examples of suitable fluidic dielectrics as shall be disclosed herein are merely by way of example and are not intended to limit in any way the scope of the invention. Also, while component materials can be mixed in order to produce the first and second fluidic dielectrics as described herein, it should be noted that the invention is not so limited. Instead, the composition of the first and second fluidic dielectrics could be formed in other ways. All such techniques will be understood to be included within the scope of the invention.

Those skilled in the art will recognize that a nominal value of permittivity ($\in_r$) for fluids is approximately 2.0. However, the fluidic dielectrics used herein can include fluids with higher values of permittivity. For example, the first or second fluidic dielectric material could be selected to have a permittivity values of between 2.0 and about 58, depending upon the amount of delay required. Similarly, the fluidic dielectric compositions can have a wide range of permeability values.

High levels of magnetic permeability are commonly observed in magnetic metals such as Fe and Co. For example, solid alloys of these materials can exhibit levels of $\mu_r$ in excess of one thousand. By comparison, the permeability of fluids is nominally about 1.0 and they generally do not exhibit high levels of permeability. However, high permeability can be achieved in a fluid by introducing metal particles/elements to the fluid. For example typical magnetic fluids comprise suspensions of ferro-magnetic particles in a conventional industrial solvent such as water, toluene, mineral oil, silicone, and so on. Other types of magnetic particles include metallic salts, organo-metallic compounds, and other derivatives, although Fe and Co particles are most common. The size of the magnetic particles found in such systems is known to vary to some extent. However, particles sizes in the range of 1 nm to 20 $\mu$m are common. The composition of particles can be selected as necessary to achieve the required permeability in the final fluidic dielectric. Magnetic fluid compositions are typically between about 50% to 90% particles by weight. Increasing the number of particles will generally increase the permeability.

Example of materials that could be used to produce fluidic dielectric materials as described herein would include oil (low permittivity, low permeability), a solvent (high permittivity, low permeability) and a magnetic fluid, such as combination of a solvent and a ferrite (high permittivity and high permeability). A hydrocarbon dielectric oil such as Vacuum Pump Oil MSDS-12602 could be used to realize a low permittivity, low permeability fluid, low electrical loss fluid. A low permittivity, high permeability fluid may be realized by mixing the same hydrocarbon fluid with magnetic particles such as magnetite manufactured by FerroTec Corporation of Nashua, N.H., or iron-nickel metal powders manufactured by Lord Corporation of Cary, N.C. for use in ferrofluids and magnetoresrictive (MR) fluids. Additional ingredients such as surfactants may be included to promote uniform dispersion of the particles. Fluids containing electrically conductive magnetic particles require a mix ratio low enough to ensure that no electrical path can be created in the mixture. Solvents such as formamide inherently possess a relatively high permittivity. Similar techniques could be used to produce fluidic dielectrics with higher permittivity. For example, fluid permittivity could be increased by adding high permittivity powders such as barium titanate manufactured by Ferro Corporation of Cleveland, Ohio. For broadband applications, the fluids would not have significant resonances over the frequency band of interest.

Several sets of immiscible fluid candidates exist. One example of suitable set of immiscible fluids would be acetone and certain perfluoropolyethers (PFPE) oils. PFPE oils are available under the brand name Fomblin® from Solvay Solexis, Inc. of Thorofare, N.J. Another example of a suitable set of immiscible fluids would be deionized water and a silicone-based fluid such as MRF-336AG, which is available from Lord Corporation of Cary, N.C. A variety of other groups of immiscible fluids are also possible within the scope of the invention and the foregoing examples are not intended in any way to limit the scope of the invention.

Controlling the Variable Displacement Processor

Figure 4:
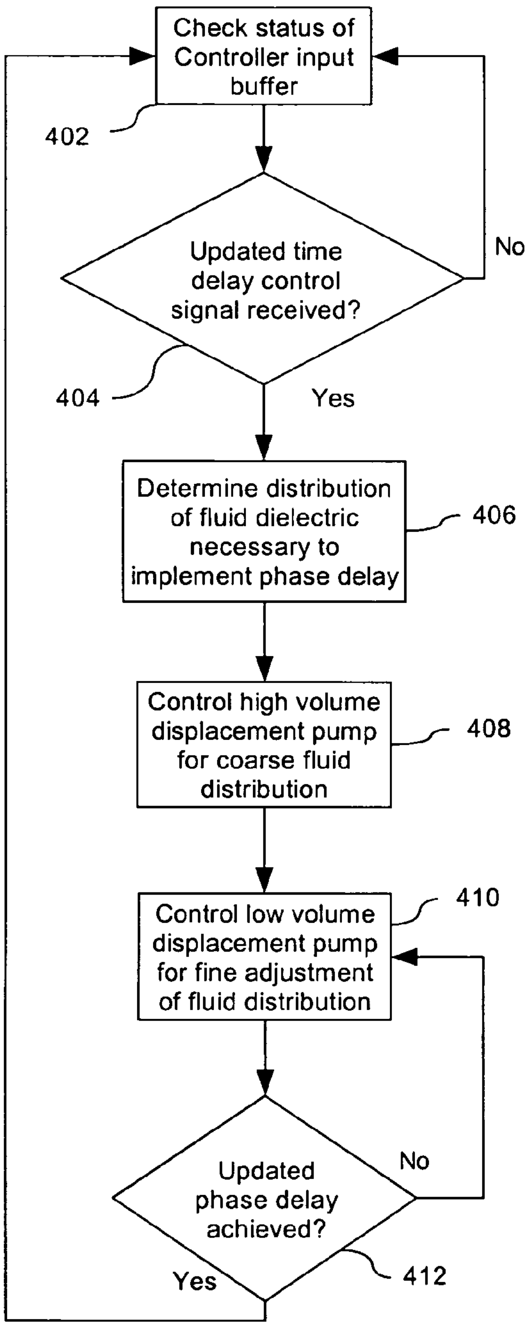
FIG. 4 is a flow chart that is useful for understanding the process of the invention.

FIG. 4 is a flowchart illustrating a process for producing a phase delay in accordance with a preferred embodiment of the invention. The process can begin in step 402 by controller 136 continually checking the status of an input buffer (not shown) for receiving control signal 137. In step 404, if the controller determines that an updated phase delay control signal has been received on the control signal input line then the controller 136 continues on to step 406. Otherwise, the controller returns to step 402 for checking the input status.

In step 406, the controller 136 can determine the necessary distribution of the fluidic dielectric materials in fluid channel 109 for producing the amount of delay indicated by the updated control signal. For example, if the first and second fluidic dielectrics are arranged as shown in FIG. 1, then the controller can determine approximately where the interface 131 must be relative to the length of the transmission line 110 in order to implement the necessary amount of phase delay. The required location of the interface 131 can be determined by one of several means One method would be to calculate the total phase delay for the transmission line 110. Given the permittivity and permeability of the fluidic dielectrics, and any surrounding solid dielectric, the propagation velocity could be calculated for the portions of the transmission line coupled to each of the first and second fluidic dielectrics 130, 132. These values could be calculated each time a new delay time request is received or could be stored in a memory associated with controller 136. In either case, the controller can use this information to calculate the necessary location for the fluid interface 131 required to implement a particular amount of delay specified. Once the required location of the interface 131 has been calculated, the controller can control the displacement fluid processor 120 in step 406 to move high volume displacement pump piston 126 to provide a coarse adjustment of the location of the fluid interface 131. Fine adjustments can be made in step 410 using the low volume displacement pump.

As an alternative to calculating the necessary location for the fluid interface 131, the controller 136 could also make use of a look-up-table (LUT). The LUT can contain cross-reference information for determining control data for the distribution of the fluidic dielectric material necessary to achieve various different delay times. For example, a calibration process could be used to identify the specific digital control signal values communicated from controller 136 to displacement fluid processor 120 that are necessary to adjust the relative position of pistons 126 and/or 128 to achieve a set of specific delay values. These digital control signal values could then be stored in the LUT. Thereafter, when control signal 137 is updated to a new requested delay time, the controller 136 can immediately obtain the corresponding digital control signal for causing displacing fluid processor 120 to move pistons 126 and 128 to the proper position for producing the required delay.

As an alternative, or in addition to the foregoing methods, the controller 136 could make use of an empirical approach that injects a signal at RF input port 104 and measures the delay to RF output port 106. As shown in step 412, the system could check to see whether the updated phase delay had been achieved. A feedback loop could then be employed to control the displacement pump 122 and/or 124 to produce the desired delay characteristic.

RF Unit Structure, Materials and Fabrication

In theory, constant characteristic impedance can be obtained for a transmission line by maintaining a constant ratio of permittivity to permeability in the dielectric to which the line is coupled. Accordingly, in those instances where the transmission line is for all practical purposes coupled exclusively to the fluidic dielectric, then it is merely necessary to maintain a constant ratio of $\in_r/\mu_r$, where $\in_r$ is the permittivity of the fluidic dielectric 130, and $\mu_r$ is the permeability of the fluidic dielectric 130.

However, in the case where the transmission line is also partially coupled to a solid dielectric, then the permeability $\mu_r$ necessary to keep the characteristic impedance of the line constant can be expressed as follows:

$$\mu_r=\mu_{r,sub}(\in_r/\in_{r,sub})$$

where $\mu_{r,sub}$ is the permeability of the solid dielectric substrate 102, $\in_r$ is the permittivity of the fluidic dielectric 130 and $\in_{r,sub}$ is the permittivity of the solid dielectric substrate 102. When this condition applies, the effective index describing the velocity of the wave $n_{eff}$, is approximately equal to $n_{0,eff}(\in_r/\in_{r,sub})$ where $n_{0,eff}$ is the index in the solid dielectric substrate.

Note that when the dielectric properties of a transmission line are inhomogeneous along the direction of wave propagation, but the inhomogeneities are small relative to the wavelength in the medium, the line typically behaves like a homogenous line with dielectric properties between the extremes of the inhomogeneous line. Exceptions to this rule may occur when the inhomogeneities are periodic with a period harmonically related to the wavelength. In most other cases, however, inhomogeneous line will generally be characterized by an "effective permittivity" $\in_{r,eff}$ and an "effective permeability" $\mu_{r,eff}$ which are merely the properties of the hypothetical equivalent homogeneous structure. This condition may apply to specific embodiments of the current invention if the fluid channel illustrated in FIG. 2 is small, for example where the diameter of the fluid channel is less than 1/10 of the wavelength in the medium. In this case, the fluid properties can be chosen to maintain a constant ratio of effective permeability to effective permittivity with respect to the transmission line with an empty fluid channel. This will maintain constant impedance with a variable index of refraction as described above. The scope of the invention is not restricted to transmission lines for which this condition is enforced.

At this point it should be noted that while the embodiment of the invention in FIGS. 1–3 are shown essentially in the form of a microstrip or buried microstrip construction, the invention herein is not intended to be so limited. Instead, the invention can be implemented using any type of transmission line by replacing at least a portion of a conventional solid dielectric material that is normally coupled to the transmission line with a fluidic dielectric as described herein. For example, and without limitation, the invention can be implemented in transmission line configurations including conventional waveguides, stripline, microstrip, coaxial lines, and embedded coplanar waveguides. All such structures are intended to be within the scope of the invention.

According to one aspect of the invention, the solid dielectric substrate 102 can be formed from a ceramic material. For example, the solid dielectric substrate can be formed from a low temperature co-fired ceramic (LTCC). Processing and fabrication of RF circuits on LTCC is well known to those skilled in the art. LTCC is particularly well suited for the present application because of its compatibility and resistance to attack from a wide range of fluids. The material also has superior properties of wetability and absorption as compared to other types of solid dielectric material. These factors, plus LTCC's proven suitability for manufacturing miniaturized RF circuits, make it a natural choice for use in the present invention.

Those skilled in the art will recognize that a wide variety of alternatives could be used to adjust the distribution of the fluidic dielectrics. Accordingly, the specific implementations described herein are intended to be merely examples and should not be construed as limiting the invention.

We claim:

1. A phase delay line, comprising:

an RF transmission line;

a structure defining a fluid channel having a serpentine configuration coupled to said RF transmission line along of a length of said transmission line, said serpentine configuration forming a plurality of fluid channel sections that are spaced apart from each other along the length of said RF transmission line and aligned generally transverse to a direction of signal propagation along said RF transmission line; and at least one variable displacement fluid processor for changing a distribution of a fluidic dielectric within said fluid channel in response to a phase delay control signal;

wherein a phase delay of said transmission line is selectively varied by changing said distribution of said fluidic dielectric in said fluid channel.

2. The phase delay line according to claim 1 further comprising a second fluidic dielectric within said fluid channel, said first fluidic dielectric having at least one of a first permittivity and a first permeability that is different respectively from at least one of a second permittivity and a second permeability of said second fluidic dielectric; and wherein said at least one variable displacement fluid processor changes a distribution of said first and second fluidic dielectric relative to said transmission line.

3. The phase delay line according to claim 2 wherein said first and second fluidic dielectrics are immiscible.

4. The phase delay line according to claim 2 wherein said first and second fluidic dielectrics are separated by an immiscible fluid interface.

5. The phase delay line according to claim 3 wherein said fluid channel extends along a length of said transmission line and said distribution of said first and second fluidic dielectrics is varied along a length of said fluid channel.

6. The phase delay line according to claim 1 wherein said fluidic dielectric has a permeability and a permittivity selected for maintaining a constant characteristic impedance along an entire length of said RF transmission line.

7. The phase delay line according to claim 1 wherein said transmission line is also coupled to a solid dielectric substrate material.

8. The phase delay line according to claim 7 wherein said solid dielectric substrate is formed from a ceramic material.

9. The phase delay line according to claim 7 wherein said solid dielectric substrate is formed from a low temperature co-fired ceramic.

10. A phase delay line, comprising:

an RF transmission line:

a structure defining a fluid channel having a serpentine configuration coupled to said RF transmission line along at least a portion of a length of said transmission line; and at least one variable displacement fluid processor for changing a distribution of a fluidic dielectric within said fluid channel in response to a phase delay control signal;

wherein a phase delay of said transmission line is selectively varied by changing said distribution of said fluidic dielectric in said fluid channel, and said variable displacement fluid processor comprises at least one high volume pump for coarse adjustment of said distribution and one low volume displacement pump for fine adjustment of said distribution.

11. The phase delay line according to claim 2 wherein said variable displacement fluid processor comprises at least one fluid conduit for communicating each of said first and second fluidic dielectrics to said fluid channel.

12. The phase delay line according to claim 11 further comprising a first fluid port communicating said first fluidic dielectric from said conduit to said fluid channel portion and a second fluid port communicating said second fluidic dielectric from a second conduit to said fluid channel portion, and an immiscible fluid interface separating said first and second fluidic dielectrics.

13. The phase delay line according to claim 1 wherein said fluidic dielectric is comprised of an industrial solvent.

14. The phase delay line according to claim 1 wherein at least one component of said fluidic dielectric is comprised of an industrial solvent that has a suspension of magnetic particles contained therein.

15. The phase delay line according to claim 14 wherein said magnetic particles are formed of a material selected from the group consisting of ferrite, metallic salts, and organo-metallic particles.

16. A phase delay line, comprising:

an RF transmission line;

a structure defining a fluid channel having a serpentine configuration coupled to said RF transmission line along of a length of said transmission line, said serpentine configuration forming a plurality of fluid channel sections that are spaced apart from each other along the length of said RF transmission line and aligned generally transverse to a direction of signal propagation along said RF transmission line; and at least one variable displacement fluid processor for changing a distribution of a fluidic dielectric within said fluid channel in response to a phase delay control signal;

wherein a phase delay of said RF transmission line is maintained constant as an operational frequency of said RF transmission line is varied, said phase delay maintained constant by changing said distribution of said fluidic dielectric in said fluid channel.

17. A method for producing a phase delay for an RF signal comprising the steps of:

propagating said RF signal along a length of an RF transmission line;

positioning a fluidic dielectric within a fluid channel having a serpentine configuration, and forming with said serpentine configuration a plurality of fluid channel sections that are spaced apart from each other along the length of said RF transmission line and aligned generally transverse to a direction of signal propagation along said RF transmission line so that said fluid dielectric is coupled to said RF transmission line along at least a portion of a length of said transmission line; and positioning said fluidic dielectric within said fluid channel to selectively control said coupling to vary a phase delay of said transmission line.

18. The method according to claim 17 further comprising the steps of:

positioning a second fluidic dielectric within said fluid channel, said first fluidic dielectric having at least one of a first permittivity and a first permeability that is different respectively from at least one of a second permittivity and a second permeability of said second fluidic dielectric; and changing a distribution of said first and second fluidic dielectrics relative to said transmission line.

19. The method according to claim 18 wherein said first and second fluidic dielectrics are immiscible.

20. The method according to claim 18 wherein said first and second fluidic dielectrics are separated by an immiscible fluid interface.

21. The method according to claim 20 wherein said fluid channel extends along a length of said transmission line and said distribution of said first and second fluidic dielectrics is varied along a length of said fluid channel.

22. The method according to claim 17 further comprising the step of also coupling said RF transmission line a solid dielectric substrate material.

23. The method according to claim 22 further comprising the step of forming said solid dielectric substrate from a ceramic material.

24. The method according to claim 22 further comprising the step of selecting a material for said solid dielectric substrate to be a low temperature co-fired ceramic.

25. The method according to claim 22 further comprising the step of selecting said fluidic dielectric to have at least one of a permittivity and a permeability that is different as compared to said solid dielectric substrate.

26. The method according to claim 17 further comprising the step of selecting said fluidic dielectric to have at least one of a permeability and a permittivity selected for maintaining a constant characteristic impedance along a length of said RF transmission line.

27. The method according to claim 17 further comprising the step of selecting a material for said fluidic dielectric to include an industrial solvent.

28. The method according to claim 17 further comprising the step of selecting a material of said fluidic dielectric to include an industrial solvent that has a suspension of magnetic particles contained therein.

29. The method according to claim 27 further comprising the step of selecting said magnetic particles from the group consisting of ferrite, metallic salts, and organo-metallic particles.

30. A method for producing a phase delay for an RF signal comprising the steps of:

propagating said RF signal along a length of an RF transmission line;

positioning a fluidic dielectric within a fluid channel having a serpentine configuration;

forming with said serpentine configuration a plurality of fluid channel sections that are spaced apart from each other along the length of said RF transmission line and aligned generally transverse to a direction of signal propagation along said RF transmission line so that said fluid dielectric is coupled to said RF transmission line along selected portions of a length of said transmission line; and automatically varying a position of said fluidic dielectric among said plurality of fluid channel sections to to maintain a constant phase delay as an operational frequency of said RF transmission line is varied.

* * * * *